(12) United States Patent
Shin et al.

(10) Patent No.: US 12,376,483 B2
(45) Date of Patent: **\*Jul. 29, 2025**

(54) FLEXIBLE DISPLAY DEVICE

(71) Applicant: LG DISPLAY CO., LTD., Seoul (KR)

(72) Inventors: Myeongah Shin, Seoul (KR); JinWoo Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 316 days.

This patent is subject to a terminal disclaimer.

(21) Appl. No.: 17/974,195

(22) Filed: Oct. 26, 2022

(65) Prior Publication Data
US 2023/0047362 A1 Feb. 16, 2023

Related U.S. Application Data

(63) Continuation of application No. 17/110,831, filed on Dec. 3, 2020, now Pat. No. 11,515,503.

(30) Foreign Application Priority Data

Dec. 4, 2019 (KR) .................. 10-2019-0159562

(51) Int. Cl.
*G06F 1/16* (2006.01)
*H10K 50/84* (2023.01)
(Continued)

(52) U.S. Cl.
CPC .......... *H10K 77/111* (2023.02); *G06F 1/1601* (2013.01); *H10K 50/84* (2023.02);
(Continued)

(58) Field of Classification Search
CPC ............................ G06F 1/1652; H10K 77/111
See application file for complete search history.

(56) References Cited

U.S. PATENT DOCUMENTS 8,823,042 B2 9/2014 Kim
10,271,425 B1 * 4/2019 Hassemer .......... G06V 40/1306
(Continued)

FOREIGN PATENT DOCUMENTS

| JP | 2019-012099 A | 1/2019 |
|---|---|---|
| KR | 10-2008-0091609 A | 10/2008 |
| KR | 10-2014-0000787 A | 1/2014 |

OTHER PUBLICATIONS

Office Action dated Sep. 25, 2024, issued in corresponding KR Patent Application No. 10-2019-0159562 (with machine translation).

*Primary Examiner* — Adrian S Wilson
(74) *Attorney, Agent, or Firm* — Morgan, Lewis & Bockius LLP

(57) ABSTRACT

According to an aspect of the present disclosure, a flexible display device includes: a display panel which includes a display area and a bending area extending from one side of the display area to be bent; a first back plate disposed on a rear surface of the display area; a first cushion tape disposed on a rear surface of the first back plate; a heat radiation sheet disposed on a rear surface of the first cushion tape; a second cushion tape which is disposed below the heat radiation sheet and absorbs a damage from the outside; and a bottom hole which passes through the first cushion tape, the heat radiation sheet, and the second cushion tape.

18 Claims, 15 Drawing Sheets

(51) Int. Cl.
  *H10K 50/87* (2023.01)
  *H10K 59/131* (2023.01)
  *H10K 59/80* (2023.01)
  *H10K 77/10* (2023.01)
  *H10K 102/00* (2023.01)

(52) U.S. Cl.
  CPC ........... *H10K 50/87* (2023.02); *H10K 59/131* (2023.02); *H10K 59/87* (2023.02); *H10K 59/8794* (2023.02); *H10K 2102/311* (2023.02)

(56) References Cited

U.S. PATENT DOCUMENTS

| | | | |
|---|---|---|---|
| 10,409,329 B2 * | 9/2019 | Fan | G06V 40/13 |
| 10,622,415 B2 * | 4/2020 | Xu | G06V 40/1318 |
| 10,748,976 B2 | 8/2020 | Nishimura | |
| 10,966,329 B2 | 3/2021 | Park et al. | |
| 11,013,108 B2 * | 5/2021 | Kim | H05K 1/189 |
| 11,088,236 B2 * | 8/2021 | Jeon | H10K 59/126 |
| 11,183,653 B2 * | 11/2021 | Lee | H10K 77/111 |
| 11,515,503 B2 * | 11/2022 | Shin | H10K 50/84 |
| 2003/0058376 A1 * | 3/2003 | Zhang | G02F 1/136227 |
| | | | 349/43 |
| 2006/0139271 A1 * | 6/2006 | Okuda | G02F 1/133308 |
| | | | 345/88 |
| 2008/0246744 A1 | 10/2008 | Park et al. | |
| 2012/0098736 A1 * | 4/2012 | Yee | G06F 1/169 |
| | | | 345/76 |
| 2012/0299009 A1 * | 11/2012 | Ohtani | H01L 33/16 |
| | | | 257/E29.273 |
| 2013/0341597 A1 | 12/2013 | Kim | |
| 2014/0267949 A1 * | 9/2014 | Kim | G06F 1/26 |
| | | | 361/728 |
| 2016/0004899 A1 * | 1/2016 | Pi | G06V 40/1329 |
| | | | 345/173 |
| 2016/0070304 A1 * | 3/2016 | Shin | G02F 1/133305 |
| | | | 361/679.26 |
| 2017/0213486 A1 * | 7/2017 | Zhou | G06F 1/1652 |
| 2017/0287992 A1 * | 10/2017 | Kwak | G06F 1/1637 |
| 2017/0351364 A1 * | 12/2017 | Kim | G06F 21/32 |
| 2018/0089492 A1 * | 3/2018 | Cai | H04M 1/0266 |
| 2019/0006444 A1 * | 1/2019 | Nishimura | H01L 23/4985 |
| 2021/0175462 A1 * | 6/2021 | Shin | G06F 1/1601 |

* cited by examiner

FLEXIBLE DISPLAY DEVICE

CROSS-REFERENCE TO RELATED APPLICATIONS

This application is a Continuation of co-pending U.S. application Ser. No. 17/110,831 filed on Dec. 3, 2020, which claims the priority of Korean Patent Application No. 10-2019-0159562 filed on Dec. 4, 2019, in the Korean Intellectual Property Office. The disclosure of each of the above prior U.S. and Korean patent applications is incorporated herein by reference.

BACKGROUND

Technical Field

The present disclosure relates to a flexible display device, and more particularly, to a flexible display device in which a hole is formed on a rear surface of the display panel.

Discussion of the Related Art

As it enters the information era, a field of a display device which visually expresses electrical information signals has been rapidly developed and studies are continued to improve performances of various display devices, such as a thin-thickness, a light weight, and low power consumption.

A representative display device may include a liquid crystal display device (LCD), a field emission display device (FED), an electro-wetting display device (EWD), and an organic light emitting display device (OLED).

An electroluminescent display device which is represented by an organic light emitting display device is a self-emitting display device so that a separate light source is not necessary, which is different from a liquid crystal display apparatus. Therefore, the electroluminescent display device may be manufactured to have a light weight and a small thickness. Further, since the electroluminescent display device is advantageous not only in terms of power consumption due to the low voltage driving, but also in terms of color implementation, a response speed, a viewing angle, a contrast ratio (CR), it is expected to be utilized in various fields.

In the electroluminescent display device, an emissive layer EML is disposed between two electrodes configured by an anode and a cathode. When holes in the anode are injected into the emissive layer and electrons in the cathode are injected into the emissive layer, the injected holes and electrons are recombined and form excitons in the emissive layer to emit light.

The emissive layer includes a host material and a dopant material, and two materials interact with each other so that the host generates excitons from the electrons and holes and transmits energy to the dopant. The dopant is a pigment organic material which is added in a small amount and receives the energy from the host and converts the energy into light.

The electroluminescent display device is encapsulated with glass, metal, or film to block the flowing of the moisture or oxygen into the electroluminescent display device. By doing this, the oxidation of the emissive layer or the electrode may be suppressed and the emissive layer or the electrode may be protected from the mechanical or physical damages applied from the outside.

SUMMARY

As the size of the display device is reduced, efforts are continued to reduce a bezel area which is an outer periphery of the display area to increase an effective display screen size with the same area of the display device.

However, in the bezel area corresponding to the non-display area, a wiring line and a driving circuit for driving the screen are disposed so that there is a limitation in reducing the bezel area.

Recently, with regard to a flexible electroluminescent display device which maintains a display performance even though it is bent by applying a flexible substrate of a flexible material such as plastic, there is an effort to reduce the bezel area by bending the non-display area of the flexible substrate to reduce the bezel area while ensuring the area for the wiring line and the driving circuit.

For the electroluminescent display device using a flexible substrate such as plastic, it is necessary to ensure the flexibility of various insulating layers disposed on the substrate and the wiring lines formed of a metal material and suppress the defect such as a crack which may be caused by the bending.

In the meantime, in the flexible electroluminescent display device, in order to embed various sensors, such as a fingerprint recognition sensor, on a rear surface of the display panel, a hole may be additionally formed. During the process of inserting the fingerprint recognition sensor into the above-described hole, a physical damage may be applied to a partial area of the display panel in which the hole is formed. Due to this, an image quality of a partial area of the display panel in which the hole is formed may be degraded.

Accordingly, the inventors of the present disclosure recognized the above-mentioned problems and invented a flexible display device which enhanced a damage absorption rate of a partial area of the display panel in which the hole was formed.

The inventors of the present disclosure invented a flexible display device in which a yield of a sensor mounting process of the flexible display device was improved.

Accordingly, embodiments of the present disclosure are directed to a flexible display device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible display device comprises: a display panel which includes a display area and a bending area extending from one side of the display area to be bent; a first back plate disposed on a rear surface of the display area; a first cushion tape disposed on a rear surface of the first back plate; a heat radiation sheet disposed on a rear surface of the first cushion tape; a second cushion tape which is disposed below the heat radiation sheet and absorbs a damage from the outside; and a bottom hole which passes through the first cushion tape, the heat radiation sheet, and the second cushion tape.

In another aspect, a flexible display device comprises: a display panel which includes a first flat portion, a second flat portion, and a curved portion located between the first flat portion and the second flat portion; a first back plate disposed on a rear surface of the first flat portion of the display panel; a first back plate disposed on a rear surface of the first flat portion of the display panel; a first cushion tape and a heat radiation sheet disposed between the first back plate and the second back plate; a bottom hole which passes through the first cushion tape and the heat radiation sheet; and a second cushion tape which encloses an entrance of the bottom hole and absorbs a damage from the outside.

Other detailed matters of the exemplary embodiments are included in the detailed description and the drawings.

In the flexible display device according to the exemplary embodiment of the present disclosure, the second cushion tape which absorbs the damage is disposed in the bottom hole so that the defective image due to the dent in accordance with the sensor inserting process may be suppressed.

The flexible display device according to the exemplary embodiment of the present disclosure may improve a yield of the process of inserting the sensor into the bottom hole of the flexible substrate.

The effects of the flexible display device according to the exemplary embodiments of the present disclosure are not limited to the contents exemplified above, and more various effects are included in the present specification.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
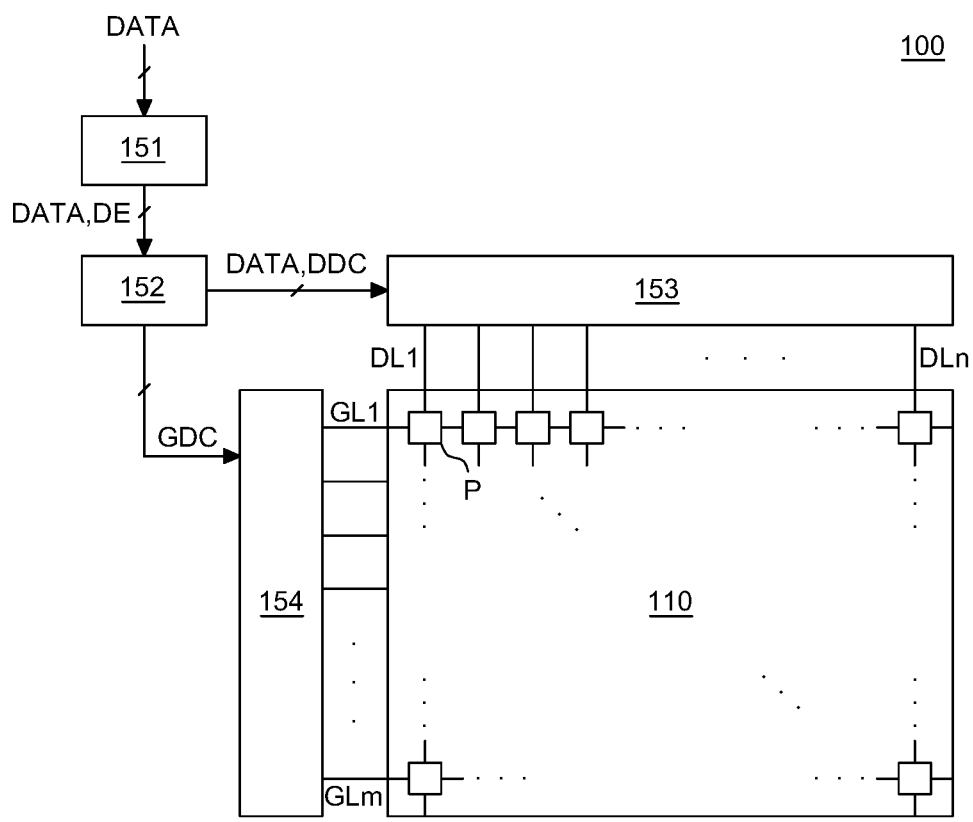
FIG. 1 is a block diagram of a flexible display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a flexible display device according to exemplary embodiments of the present disclosure will be described in detail with reference to accompanying drawings.

FIG. 1 is a block diagram of a flexible display device according to an exemplary embodiment of the present disclosure.

Referring to FIG. 1, a flexible display device 100 according to an exemplary embodiment of the present disclosure includes an image processor 151, a timing controller 152, a data driver 153, a gate driver 154, and a display panel 110.

The image processor 151 outputs a data signal DATA supplied from the outside and a data enable signal DE. The image processor 151 may output one or more of a vertical synchronization signal, a horizontal synchronization signal, and a clock signal in addition to the data enable signal DE.

The timing controller 152 is supplied with the data signal DATA together with a driving signal including the data enable signal DE or the vertical synchronization signal, the horizontal synchronization signal, and the clock signal, from the image processor 151. The timing controller 152 may output a gate timing control signal GDC for controlling an operation timing of the gate driver 154 and a data timing control signal DDC for controlling an operation timing of the data driver 153, based on the driving signal.

The data driver 153 samples and latches the data signal DATA supplied from the timing controller 152 in response to the data timing control signal DDC supplied from the timing controller 152 to convert the data signal into a gamma reference voltage and output the converted gamma reference voltage. The data driver 153 outputs the data signal DATA through data lines DL1 to DLn.

The gate driver 154 may output the gate signal while shifting a level of the gate voltage, in response to the gate timing control signal GDC supplied from the timing controller 152. The gate driver 154 may output the gate signal through gate lines GL1 to GLm.

The display panel 110 may display images while a sub pixel P emits light in response to the data signal DATA and the gate signal supplied from the data driver 153 and the gate driver 154. A detailed structure of the sub pixel P will be described in detail with reference to FIGS. 2, 4A, and 4B.

Figure 2:
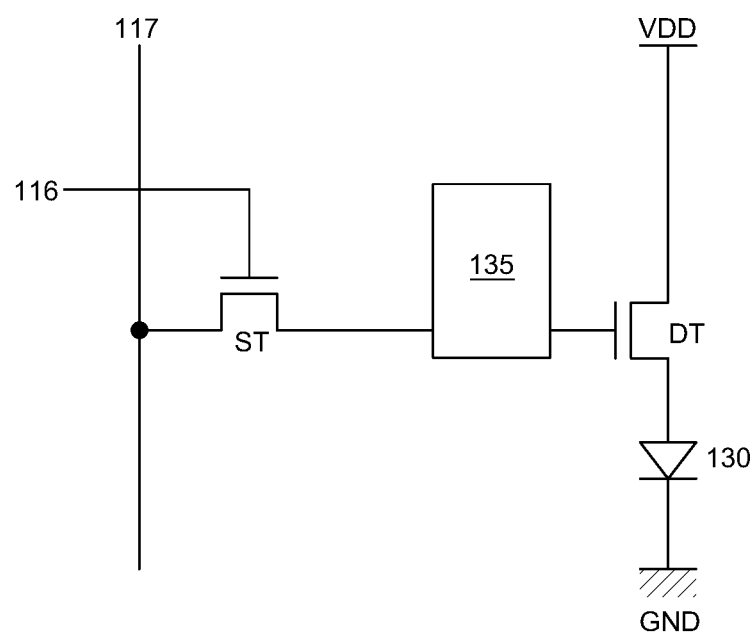
FIG. 2 is a circuit diagram of a sub pixel included in a flexible display device according to an exemplary embodiment of the present disclosure.

FIG. 2 is a circuit diagram of a sub pixel included in a flexible display device according to an exemplary embodiment of the present disclosure.

Referring to FIG. 2, the sub pixel of the flexible display device 100 according to the exemplary embodiment of the present invention includes a switching transistor ST, a driving transistor DT, a compensation circuit 135, and a light emitting diode 130.

The light emitting diode 130 may operate to emit light in accordance with a driving current formed by the driving transistor DT.

The switching transistor ST may perform a switching operation such that a data signal supplied through the data line 117 is stored in s capacitor as a data voltage in response to a gate signal supplied through the gate line 116.

The driving transistor DT may operate to flow a predetermined driving current between a high potential power line VDD and a low potential power line GND in response to a data voltage stored in the capacitor.

The compensation circuit 135 is a circuit for compensating for a threshold voltage of the driving transistor DT and includes one or more thin film transistors and capacitors. A configuration of the compensation circuit 135 may vary depending on a compensating method.

For example, the sub pixel illustrated in FIG. 2 is configured by a 2T (transistor) 1C (capacitor) structure including a switching transistor ST, a driving transistor DT, a capacitor, and a light emitting diode 130. When the compensation circuit 135 is added, the sub pixel may be formed in various forms such as 3T1C, 4T2C, 5T2C, 6T1C, 6T2C, 7T1C, and 7T2C.

Figure 3:
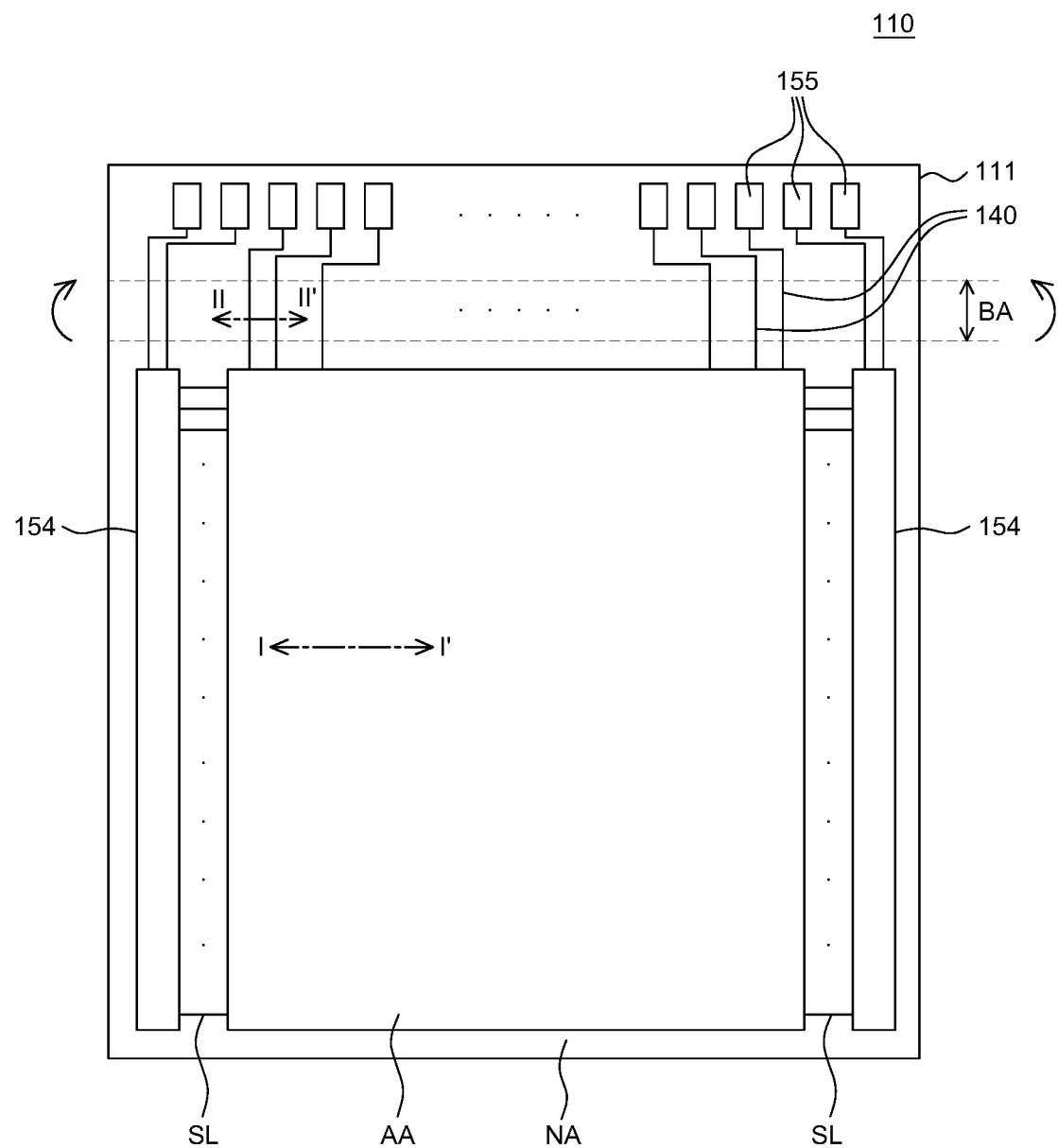
FIG. 3 is a plan view of a flexible display device according to an exemplary embodiment of the present disclosure.

FIG. 3 is a plan view of a flexible display device according to an exemplary embodiment of the present disclosure.

FIG. 3 illustrates a state in which a flexible substrate 111 of the flexible display device 110 according to the exemplary embodiment of the present disclosure is not bent as an example.

Referring to FIG. 3, the flexible display device 110 may include a display area AA in which a pixel which actually emits light by a thin film transistor and a light emitting diode is disposed on the flexible substrate 111 and a non-display area NA which is a bezel area enclosing an edge of the display area AA.

In the non-display area NA of the flexible substrate 111, a circuit such as a gate driver 154 for driving the flexible display device 110 and various signal lines such as a scan line SL may be disposed.

The circuit for driving the flexible display device 110 may be disposed on the substrate 111 in a gate in panel (GIP) manner or connected to the flexible substrate 111 in a tape carrier package (TCP) or a chip on film (COF) manner.

At one side of the substrate 111 of the non-display area NA, a pad 155 which is a metal pattern is disposed so that an external module may be bonded thereto.

A part of the non-display area NA of the flexible substrate 111 is bent in a bending direction as illustrated by an arrow to form a bending area BA.

The non-display area NA of the flexible substrate 111 is an area where a wiring line and a driving circuit for driving a screen are disposed. The non-display area NA is not an area where the images are displayed so that the non-display area does not need to be visible from a top surface of the flexible substrate 111. Accordingly, a partial area of the non-display area NA of the flexible substrate 111 is bent to reduce the bezel area BA while ensuring an area for the wiring lines and the driving circuit.

Various wiring lines may be formed on the flexible substrate 111. The wiring line may be formed in the display area AA of the substrate 111 or a circuit line 140 formed in the non-display area NA connects the driving circuit, the gate driver or the data driver to each other to transmit a signal.

The circuit line 140 is formed of a conductive material and may be formed of a conductive material having an excellent ductility to reduce the crack generated at the time of bending the substrate 111. The circuit line 140 may be formed of a conductive material having an excellent ductility such as gold (Au), silver (Ag), or aluminum (Al) or may be formed of one of various conductive materials used in the display area AA. The circuit line 140 may also be formed of molybdenum (Mo), chrome (Cr), titanium (Ti), nickel (Ni), neodymium (Nd), copper (Cu), and an alloy of silver (Ag) and magnesium (Mg).

The circuit line 140 may be configured by a multi-layered structure including various conductive materials and for example, configured by a triple layered structure of titanium (Ti)/aluminum (Al)/titanium (Ti), but is not limited thereto.

When the circuit line 140 formed in the bending area BA is bent, a tensile force is applied thereto. The largest tensile force may be applied to the circuit line 140 which extends in the same direction as the bending direction on the flexible substrate 111 so that the circuit line may be cracked or disconnected. Therefore, the circuit line 140 is not formed to extend in the bending direction, but at least a part of the circuit line 140 disposed to include the bending area BA is formed to extend in a diagonal direction which is different from the bending direction so that the tensile force may be minimized.

The circuit line 140 disposed to include the bending area BA may be formed in various shapes, for example, may be formed with a trapezoidal wave shape, a triangular wave shape, a sawtooth wave shape, a sinusoidal wave shape, an omega (Ω) shape, or a rhombus shape.

Figure 4A:
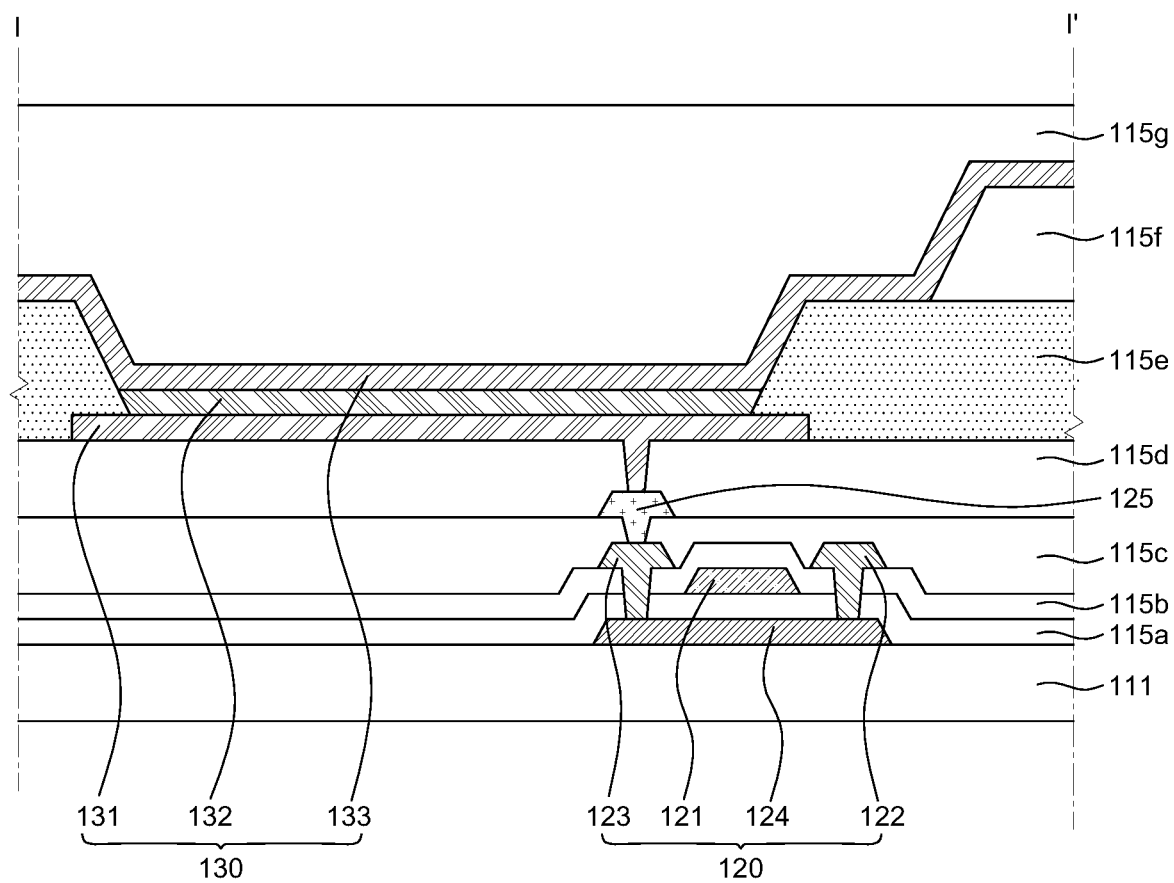
FIG. 4A is a cross-sectional view taken along the line I-I' of FIG. 3.

FIG. 4A is a cross-sectional view taken along the line I-I' of FIG. 3.

Figure 4B:
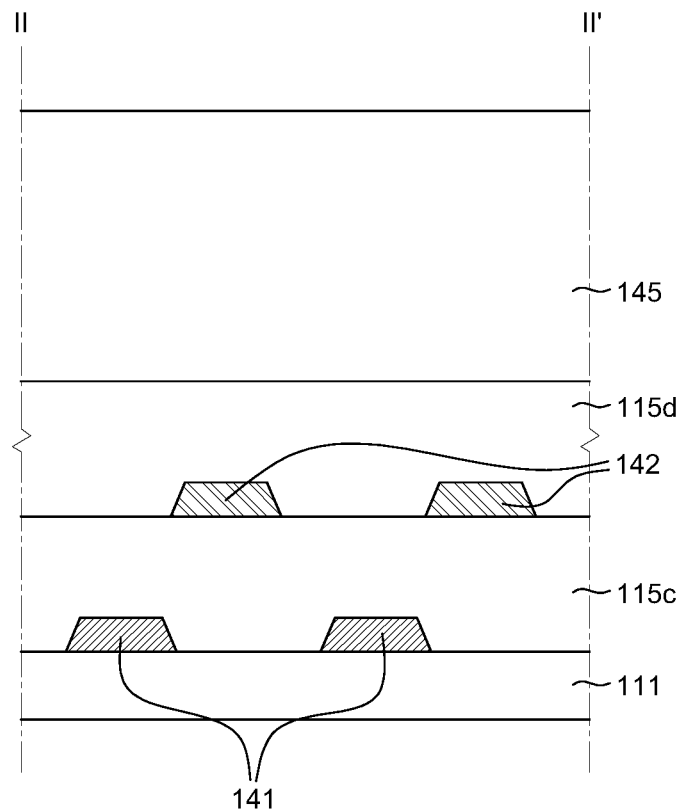
FIG. 4B is a cross-sectional view taken along the line II-II' of FIG. 3.

FIG. 4B is a cross-sectional view taken along the line II-II' of FIG. 3.

FIG. 4A is a cross-section I-I' of a detailed structure of the display area AA illustrated in FIG. 3.

Referring to FIG. 4, the substrate 111 serves to support and protect components of the flexible display device 100 disposed thereabove.

Recently, the flexible substrate 111 may use a soft material having a flexible characteristic such as plastic.

The flexible substrate 111 may be a film type including one of a group consisting of a polyester-based polymer, a silicon-based polymer, an acrylic polymer, a polyolefin-based polymer, and a copolymer thereof.

For example, the flexible substrate 111 may be formed of at least one of polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, cycloolefin copolymer (COC), cycloolefin polymer (COP), polyethylene (PE), polypropylene (PP), polyimide (PI), polymethylmethacrylate (PMMA), polystyrene (PS), polyacetal (POM), polyether ether ketone (PEEK), polyester sulfone (PES), polytetrafluoroethylene (PTFE), polyvinyl chloride (PVC), polycarbonate (PC), polyvinylidene fluoride (PVDF), perfluoroalkyl polymer (PFA), styrene acrylic nitrile copolymer (SAN), and a combinations thereof.

A buffer layer may be further disposed on the flexible substrate 111. The buffer layer suppresses permeation of moisture or other impurities through the flexible substrate 111 and planarizes a surface of the flexible substrate 111. The buffer layer is not an essential component and may be omitted depending on a type of a thin film transistor 120 disposed on the flexible substrate 111.

The thin film transistor 120 is disposed on the flexible substrate 111 and includes a gate electrode 121, a source electrode 122, a drain electrode 123, and a semiconductor layer 124.

In this case, the semiconductor layer 124 may be configured by amorphous silicon or polycrystalline silicon but is not limited thereto. The polycrystalline silicon has a more excellent mobility than that of the amorphous silicon so that energy power consumption is low, and a reliability is excellent. Therefore, the polycrystalline silicon may be applied to the driving thin film transistor in the pixel.

The semiconductor layer 124 may be configured by an oxide semiconductor. The oxide semiconductor has excellent mobility and uniformity. The oxide semiconductor may be configured by an indium tin gallium zinc oxide (InSnGaZnO) based material which is a quaternary metal oxide, an indium gallium zinc oxide (InGaZnO) based material, an indium tin zinc oxide (InSnZnO) based material, a tin gallium zinc oxide (SnGaZnO) based material, an aluminum gallium zinc oxide (AlGaZnO) based material, an indium aluminum zinc oxide (InAlZnO) based material, a tin aluminum zinc oxide (SnAlZnO) based material which are ternary metal oxides, an indium zinc oxide (InZnO) based material, a tin zinc oxide (SnZnO) based material, an aluminum zinc oxide (AlZnO) based material, a zinc magnesium oxide (ZnMgO) based material, a tin magnesium oxide (SnMgO) based material, an indium magnesium oxide (InMgO) based material, an indium gallium oxide (InGaO) based material, which are bimetallic oxides, an indium oxide (InO) based material, a tin oxide (SnO) based material, and a zinc oxide (ZnO), but a composition ratio of individual elements is not limited.

The semiconductor layer 124 includes a source region and a drain region including a p-type or n-type impurity, and a channel region between the source region and the drain region and further includes a lightly doped region between the source region and the drain region which are adjacent to the channel region.

The source region and the drain region are areas where the impurities are highly doped and the source electrode 122 and the drain electrode 123 of the thin film transistor 120 may be connected thereto, respectively.

As an impurity ion, a p-type impurity or an n-type impurity is used. The p-type impurity may be one of boron (B), aluminum (Al), gallium (Ga), and indium (In) and the n-type impurity may be one of phosphorus (P), arsenic (As), and antimony (Sb).

The channel region of the semiconductor layer 124 may be doped with the n-type impurity or the p-type impurity in accordance with the NMOS or PMOS thin film transistor structure. As the thin film transistor included in the flexible display device 100 according to the exemplary embodiment of the present disclosure, the NMOS or the PMOS thin film transistor may be applicable.

A first insulating layer 115a is an insulating layer which is configured by a single layer or multiple layers of silicon oxide (SiOx) or silicon nitride (SiNx) and is disposed such that the current flowing in the semiconductor layer 124 does not flow into the gate electrode 121. The silicon oxide has a ductility which is lower than that of metal but is better than that of the silicon nitride and may be formed by a signal layer or multiple layers depending on the characteristic.

The gate electrode 121 serves as a switch which turns on or off the thin film transistor 120 based on an electric signal transmitted from the outside through a gate line. The gate electrode may be configured by a single layer or multiple layers of copper (Cu), aluminum (Al), molybdenum (Mo), chrome (Cr), gold (Au), titanium (Ti), nickel (Ni), and neodymium (Nd) which are conductive metals or an alloy thereof, but is not limited thereto.

The source electrode 122 and the drain electrode 123 are connected to the data line and allow the electrical signal transmitted from the outside to be transmitted from the thin film transistor 120 to the light emitting diode 130. The source electrode 122 and the drain electrode 123 may be configured by a single layer or multiple layers of a metal material such as copper (Cu), aluminum (Al), molybdenum (Mo), chrome (Cr), gold (Au), titanium (Ti), nickel (Ni), and neodymium (Nd) which are conductive metals or an alloy thereof, but are not limited thereto.

In order to insulate the gate electrode 121 from the source electrode 122 and the drain electrode 123, a second insulating layer 115b which is configured by a single layer or multiple layers of silicon oxide (SiOx) or silicon nitride (SiNx) may be disposed between the gate electrode 121 and the source electrode 122 and the drain electrode 123.

A passivation layer which is configured by an inorganic insulating layer such as silicon oxide (SiOx) or silicon nitride (SiNx) may be further disposed on the thin film transistor 120.

The passivation layer may serve to suppress unnecessary electrical connection between components above and below the passivation layer and suppress contamination or damage from the outside. However, the passivation layer may be omitted in accordance with a configuration and a characteristic of the thin film transistor 120 and the light emitting diode 130.

The thin film transistor 120 may be classified into an inverted staggered structure and a coplanar structure depending on the position of the components which configure the thin film transistor 120. For example, in the thin film transistor with an inverted staggered structure, the gate electrode may be located on the opposite side of the source electrode and the drain electrode with the semiconductor layer therebetween. As illustrated in FIG. 4A, in the thin film transistor 120 with a coplanar structure, the gate electrode 121 may be located on the same side as the source electrode 122 and the drain electrode 123 with respect to the semiconductor layer 124.

Even though in FIG. 4A, the thin film transistor 120 with a coplanar structure has been illustrated, the flexible display device 100 according to the exemplary embodiment of the present disclosure may include a thin film transistor with an inverted staggered structure.

For the convenience of description, FIG. 4A illustrates only a driving thin film transistor among various thin film transistors which may be included in the flexible display device 100. However, a switching thin film transistor and a capacitor may also be included in the flexible display device 100.

When a signal is applied from the gate line, the switching thin film transistor transmits a signal from the data line to the gate electrode of the driving thin film transistor. The driving thin film transistor transmits a current, which is transmitted through a power line by the signal transmitted from the switching thin film transistor, to the anode 131 and controls the emission by the current which is transmitted to the anode 131.

Planarization layers 115c and 115d are disposed on the thin film transistor 120 to protect the thin film transistor 120, relieve a step generated due to the thin film transistor 120, and reduce a parasitic capacitance generated between the thin film transistor 120, the gate line and the data line, and the light emitting diodes 130.

The planarization layers 115c and 115d may be formed of one or more materials of acrylic resin, epoxy resin, phenolic resin, polyamides resin, polyimides resin, unsaturated polyesters resin, polyphenylene resin, polyphenylene sulfides resin, and benzocyclobutene, but are not limited thereto.

The flexible display device 100 according to the exemplary embodiment of the present disclosure may include a first planarization layer 115c and a second planarization layer 115d which are sequentially laminated. That is, the first planarization layer 115c is disposed on the thin film transistor 120 and the second planarization layer 115d is disposed on the first planarization layer 115c.

A buffer layer may be disposed on the first planarization layer 115c. The buffer layer may be configured by multiple layers of silicon oxide (SiOx) to protect the component disposed on the first planarization layer 115c and may be omitted in accordance with the configuration and the characteristic of the thin film transistor 120 and the light emitting diode 130.

An intermediate electrode 125 may be connected to the thin film transistor 120 through the contact hole formed on the first planarization layer 115c. The intermediate electrode 125 is laminated so as to be connected to the thin film transistor 120 so that the data line may also be formed to have a double layered structure.

The data line may be formed to have a structure in which a lower layer formed of the same material as the source electrode 122 and the drain electrode 123 and an upper layer formed of the same material as the intermediate electrode 125 are connected. That is, the data line may be implemented with a structure in which two layers are connected in parallel so that a line resistance of the data line may be reduced.

In the meantime, a passivation layer which is configured by an inorganic insulating layer such as silicon oxide (SiOx) or silicon nitride (SiNx) may be further disposed on the first planarization layer 115c and the intermediate electrode 125. The passivation layer may serve to suppress unnecessary electrical connection between components and suppress contamination or damage from the outside. However, the passivation layer may be omitted in accordance with the configuration and the characteristic of the thin film transistor 120 and the light emitting diode 130.

The light emitting diode 130 disposed on the second planarization layer 115d includes an anode 131, a light emitting unit 132, and a cathode 133.

The anode 131 may be disposed on the second planarization layer 115d.

The anode 131 is an electrode serving to supply holes to the light emitting unit 132 and is connected to the intermediate electrode 125 through the contact hole on the second planarization layer 115d to be electrically connected to the thin film transistor 120.

The anode 131 may be configured by indium tin oxide (ITO) and indium zin oxide (IZO) which are transparent conductive materials but is not limited thereto.

When the flexible display device 100 is a top emission type which emits light to an upper portion on which the cathode 133 is disposed, the flexible display device 100 may further include a reflective layer to cause the emitted light to be reflected from the anode 131 and be more easily emitted to an upper direction where the cathode 133 is disposed.

The anode 131 may have a double-layered structure in which a transparent conductive layer configured by a transparent conductive layer and a reflective layer are sequentially laminated. Further, the anode may have a triple-layered structure in which a transparent conductive layer, a reflective layer, and a transparent conductive layer are sequentially laminated, and the reflective layer may be silver (Ag) or an alloy including silver.

A bank 115e disposed on the anode 131 and the second planarization layer 115d may divide an area which actually emits light to define a sub pixel. The bank 115e may be formed by photolithography after forming a photoresist on the anode 131. The photoresist refers to a photosensitive resin whose solubility in a developer is changed by the action of light, and a specific pattern can be obtained by exposing and developing the photoresist. The photoresist may be classified into a positive photoresist and a negative photoresist. The positive photoresist is a photoresist whose solubility of the exposed portion in the developer is increased by the exposure. When the positive photoresist is developed, a pattern from which exposed portions are removed is obtained. The negative photoresist is a photoresist whose solubility of the exposed portion in the developer is significantly lowered by the exposure. When the negative photoresist is developed, a pattern from which non-exposed portions are removed is obtained.

In order to form the light emitting unit 132 of the light emitting diode 130, a fine metal mask (FMM) which is a deposition mask may be used.

In order to suppress a damage which may be caused by contact with the deposition mask disposed on the bank 115e and maintain a predetermined distance between the bank 115e and the deposition mask, a spacer 115f may be disposed above the bank 115e. The spacer 115f is configured by one of polyimide, photoacryl, and benzocyclobutene (BCB) which are transparent organic materials.

The light emitting unit 132 is disposed between the anode 131 and the cathode 133.

The light emitting unit 132 serves to emit light and includes at least one of a hole injection layer (HIL), a hole transport layer (HTL), an emissive layer, an electron transport layer (ETL), and an electron injection layer (EIL). Some components may be omitted depending on the structure or the characteristic of the flexible display device 100. Here, as the emissive layer, an electroluminescent layer and an inorganic emissive layer may also be applied.

The hole injection 131 is disposed on the anode 131 to smoothly inject the holes.

The hole transport layer is disposed on the hole injection layer to smoothly transmit the holes to the emissive layer.

The emissive layer is disposed on the hole transport layer and includes a material which emits specific color light to emit specific color light. The light emitting material may be formed using a phosphor or a fluorescent material.

The electron injection layer may be further disposed on the electron transport layer. The electron injection layer is an organic layer which smoothly injects the electrons from the cathode 133 and may be omitted in accordance with the structure and the characteristic of the flexible display device 100.

In the meantime, an electron blocking layer or a hole blocking layer which blocks the flow of holes or electrons is further disposed to be close to the emissive layer. Therefore, a phenomenon that when the electrons are injected to the emissive layer, the electrons move from the emissive layer to pass through an adjacent hole transport layer or when the holes are injected to the emissive layer, the holes move from the emissive layer to pass through an adjacent electron transport layer is suppressed. Therefore, the luminous efficiency may be improved.

The cathode 133 is disposed on the light emitting unit 132 to supply electrons to the light emitting unit 132. Since the cathode 133 needs to supply electrons, the cathode 133 may be configured by a metal material which is a conductive material having a low work function such as magnesium (Mg) or silver-magnesium (Ag:Mg), but is not limited thereto.

When the flexible display device 100 is a top emission type, the cathode 133 may be indium tin oxide (ITO), indium zinc oxide (IZO), indium tin zinc oxide (ITZO), zinc oxide (ZnO), and tin oxide (TiO) based transparent conductive oxide.

An encapsulating unit 115g may be disposed on the light emitting diode 130 to suppress oxidation or damage of the thin film transistor 120 and the light emitting diode 130 which are components of the electroluminescent display device 100, due to moisture, oxygen, or impurities entering from the outside. The encapsulating unit 115g may be formed by laminating a plurality of encapsulating layers and a foreign matter compensating layer, and a plurality of barrier films.

The encapsulating layer is disposed on an entire upper surface of the thin film transistor 120 and the light emitting diode 130 and may be configured by one of silicon nitride (SiNx) or aluminum oxide (AlyOz) which are inorganic materials but is not limited thereto. An encapsulating layer may be further disposed on the foreign matter compensating layer disposed on the encapsulating layer.

The foreign matter compensating layer is disposed on the encapsulating layer and may use silicon oxycarbon (SIOCz), acryl, or epoxy based resin, which is an organic material, but is not limited thereto. When a defect is caused by the crack generated by foreign material or particles during the process, the foreign matter compensating layer may compensate for the defect by covering the curvature or the foreign materials.

A barrier film is disposed on the encapsulating layer and the foreign matter compensating layer so that the flexible display device 100 may delay the permeation of the oxygen and moisture from the outside. The barrier film is formed as a light-transmissive and double-sided adhesive film and configured by any one of olefin, acrylic, and silicon based insulating materials. Further, a barrier film configured by any one of cyclic olefin polymer (COP), cyclic olefin copolymer (COC), and polycarbonate (PC) may be further laminated, but the present disclosure is not limited thereto.

FIG. 4B is a cross-section II-II' of a detailed structure of the bending area BA described with reference to FIG. 3.

Some components of FIG. 4B are substantially same/similar to components illustrated in FIG. 4A and a description thereof will be omitted.

The gate signal and the data signal described with reference to FIGS. 1 to 3 are transmitted to a pixel disposed in the display area AA via a circuit line disposed in the non-display area NA of the flexible display device 100 from the outside to emit light.

When the wiring line disposed in the non-active area N/A including the bending area BA of the flexible display device 100 is formed of a single layered structure, more spaces for disposing the wiring lines are required. After depositing the conductive material, a conductive material is patterned by an etching process to form a desired shape of the wiring line. However, since there is a limitation in fineness of the etching process, more spaces are required due to the limitation in narrowing an interval between wiring lines. Therefore, a size of the non-active area NA is increased, so that there may be a difficulty in implementing a narrow bezel.

Further, when one wiring line is used to transmit one signal, if the corresponding wiring line is cracked, the signal may not be transmitted.

A crack is generated in the wiring line during the process of bending the substrate 111 or a crack is generated on another layer to be propagated to the wiring line. As described above, when the crack is generated in the wiring line, the signal to be transmitted may not be transmitted.

Therefore, the wiring line disposed in the bending area BA of the flexible display device 100 according to the exemplary embodiment of the present disclosure may be disposed as a dual wiring line of a first wiring line 141 and a second wiring line 142.

The first wiring line 141 and the second wiring line 142 are formed of a conductive material. The first wiring line 141 and the second wiring line 142 may be formed of a conductive material having an excellent ductility to reduce the crack generated during the bending of the flexible substrate 111.

The first wiring line 141 and the second wiring line 142 may be formed of a conductive material having an excellent ductility such as gold (Au), silver (Ag), or aluminum (Al). The first wiring line 141 and the second wiring line 142 may be formed by one of various conductive materials used in the display area AA, and may also be formed of molybdenum (Mo), chrome (Cr), titanium (Ti), nickel (Ni), neodymium (Nd), copper (Cu), and an alloy of silver (Ag) and magnesium (Mg). Further, the first wiring line 141 and the second wiring line 142 may be configured by a multi-layered structure including various conductive materials and for example, configured by a triple layered structure of titanium (Ti)/aluminum (Al)/titanium (Ti), but are not limited thereto.

In order to protect the first wiring line 141 and the second wiring line 142, a buffer layer formed of an inorganic insulating layer may be disposed below the first wiring line 141 and the second wiring line 142. Alternatively, a passivation layer formed of an inorganic insulating layer is formed to enclose an upper portion and a side portion of the first wiring line 141 and the second wiring line 142. Therefore, corrosion of the first wiring line 141 and the second wiring line 142 caused by reaction with moisture may be avoided.

When the first wiring line 141 and the second wiring line 142 formed in the bending area BA are bent, a tensile force may be applied. As described with reference to FIG. 3, the largest tensile force is applied to a wiring line extending in the same direction as the bending direction on the substrate 111 and a crack may be generated in the wiring line. When the severe crack is generated, the wiring line may be broken. Therefore, the wiring line is not formed to extend in the bending direction, but at least a part of the wiring line disposed to include the bending area BA is formed to extend in a diagonal direction which is different from the bending direction so that the tensile force is minimized to minimize the generation of crack. The shape of the wiring lines may be configured by a rhombus shape, a triangular wave shape, a sinusoidal wave shape, or a trapezoidal shape, but is not limited thereto.

The first wiring line 141 is disposed on the substrate 111 and the first planarization layer 115c is disposed on the first wiring line 141. The second wiring line 142 is disposed on the first planarization layer 115c and the second planarization layer 115d is disposed on the second wiring line 142. The first planarization layer 115c and the second planarization layer 115d may be formed of one or more materials of acrylic resin, epoxy resin, phenolic resin, polyamides resin, polyimides resin, unsaturated polyesters resin, polyphenylene resin, polyphenylene sulfides resin, and benzocyclobutene, but is not limited thereto.

A micro coating layer (MCL) 145 may be disposed on the second planarization layer 115d.

Since a tensile force is applied to a wiring unit disposed above the substrate 111 at the time of bending to cause a crack, the micro coating layer 145 may be formed by coating a position to be bent with a resin with a small thickness to protect the wiring line.

The micro coating layer 145 may be configured by an acrylic material such as acrylate polymer, but it is not limited thereto.

The micro coating layer 145 may adjust a neutral plane of the bending area BA.

As described above, the neutral plane means a virtual plane that is not stressed because the compressive force and the tensile force applied to the structure are canceled each other when the structure is bent. When two or more structures are laminated, a virtual neutral plane may be formed between the structures. When the entire structure is bent in one direction, structures disposed in the bending direction with respect to the neutral plane are compressed by the bending so that a compressive force is applied thereto. In contrast, the structures which are disposed in an opposite direction to the bending direction with respect to the neutral plane are stretched due to the bending so that a tensile force is applied thereto. Normally, when the structures are applied with the tensile force between the compressive force and the tensile force, the structures are more susceptible, so that when the tensile force is applied, the structures are more likely to be cracked.

The flexible substrate of the display panel 110 disposed below the neutral plane is compressed to be applied with the compressive force and the circuit lines 140 disposed above the neutral plane are applied with the tensile force so that the cracks may be generated due to the tensile force. Therefore, in order to minimize the tensile force applied to the circuit line 140, the wiring lines may be located on the neutral plane.

The micro coating layer 145 is disposed on the bending area BA to raise the neutral plane to the upward direction and the neutral plane is formed in the same position as the circuit line 140 or the circuit line is disposed to be higher than the neutral plane. Therefore, the stress is not applied, or the compressive force is applied at the time of bending, so that the crack may be suppressed.

Figure 5:
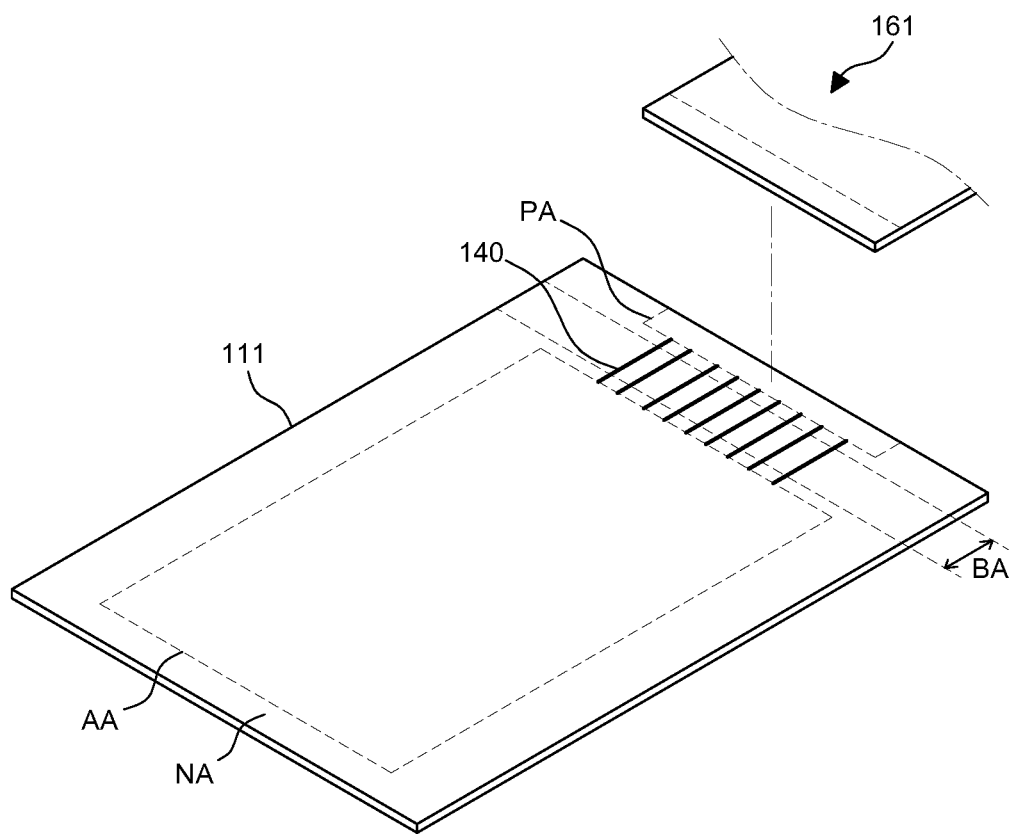
FIG. 5 is a perspective view of a flexible display device according to an exemplary embodiment of the present disclosure.

FIG. 5 is a perspective view of a flexible display device according to an exemplary embodiment of the present disclosure.

Figure 6:
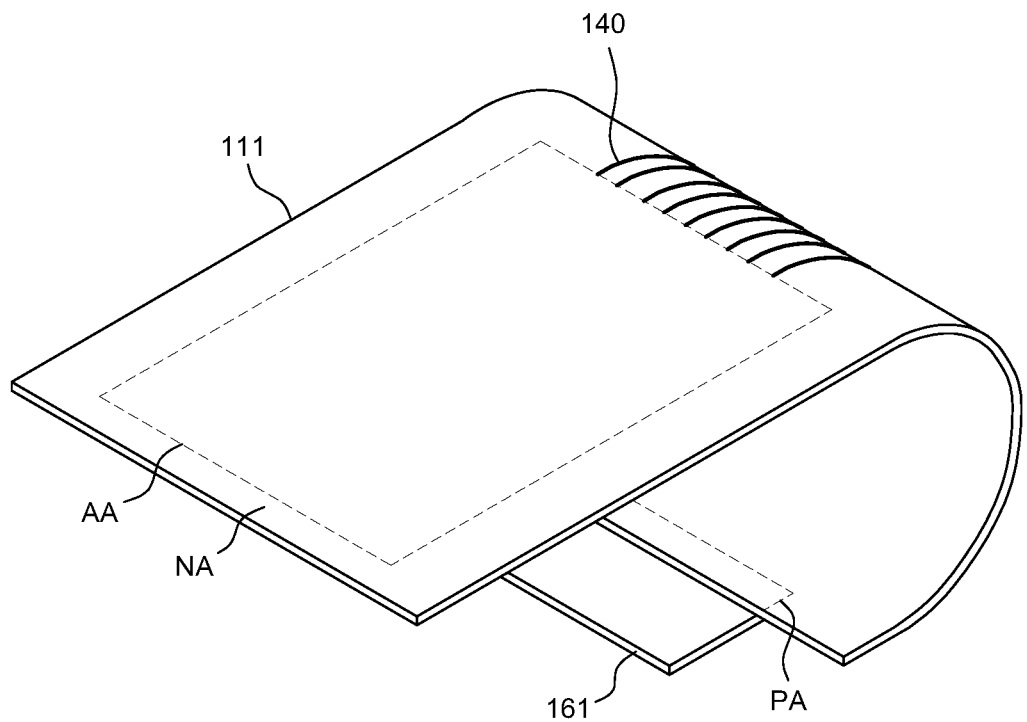
FIG. 6 is a perspective view of a bending state of a flexible display device according to an exemplary embodiment of the present disclosure.

FIG. 6 is a perspective view of a bending state of a flexible display device according to an exemplary embodiment of the present disclosure.

FIGS. 5 and 6 illustrate an example in which one side, for example, a lower side of the flexible display device is bent.

Referring to FIG. 5, the flexible display device 100 according to the exemplary embodiment of the present disclosure may include a substrate 111 and a circuit element 161.

The substrate 111 may be partitioned into a display area AA and a non-display area NA which is a bezel area enclosing an edge of the display area AA.

The non-display area AA may include a pad unit PA defined at an outside of the display area AA. A plurality of sub pixels may be disposed in the display area AA. The sub pixels are disposed in the display area AA in the red (R), green (G), and blue (B) manner or the R, G, B, and W (white) manner to implement full colors. The sub pixels may be partitioned by a gate line and a data line which intersect each other.

The circuit element 161 may include bumps (or terminals). The bump of the circuit element 161 may be bonded to pads of the pad unit PA by means of an anisotropic conductive film. The circuit element 161 may be a chip on film (COF) in which a driving IC 165 is mounted in a flexible film.

Further, the circuit element 161 may be implemented by a COG type to be directly bonded to the pads on the substrate by a chip on glass (COG) process. Further, the circuit element 161 may be a flexible circuit such as a flexible flat cable (FFC) or a flexible printed circuit (FPC). In the following exemplary embodiment, as an example of the circuit element 161, the COF will be mainly described, but the present disclosure is not limited thereto.

Driving signals supplied through the circuit element 161 such as a gate signal and a data signal may be supplied to the gate line and the data lines of the display area AA through the circuit line 140 such as a routing line.

In the flexible display device 100, a sufficient space where the pad unit PA and the circuit element 161 are located needs to be ensured in addition to the display area AA in which an input image is implement. The space corresponds to a bezel area and the bezel is perceived by the user located on the front surface of the flexible display device 100, which may degrade aesthetics somewhat.

Referring to FIG. 6, the flexible display device 100 according to the exemplary embodiment of the present disclosure may be bent in a rear direction so that a lower edge of the substrate 111 has a predetermined curvature.

The lower edge of the substrate 111 may correspond to an outside of the display area AA and may correspond to an area where the pad unit PA is located. As the substrate 111 is bent, the pad unit PA may be located to overlap the display area AA in a rear direction of the display area AA. Therefore, the bezel area which is perceived from the front surface of the flexible display device 100 may be minimized. Therefore, the bezel width is reduced so that the aesthetics may be improved.

To this end, the substrate 111 may be formed of a flexible material which is bendable. For example, the substrate 111 may be formed of a plastic material such as polyimide (PI). The circuit line 140 may be formed of a material having a flexibility. For example, the circuit line 140 may be formed of a material such as metal nano wire, metal mesh, carbon nano tube (CNT), but it is not limited thereto.

The circuit lines 140 extend from the display area AA to be disposed in the bending area BA. That is, the circuit lines 140 may extend in the bending area BA along an outer circumferential surface of the substrate 111.

Figure 7:
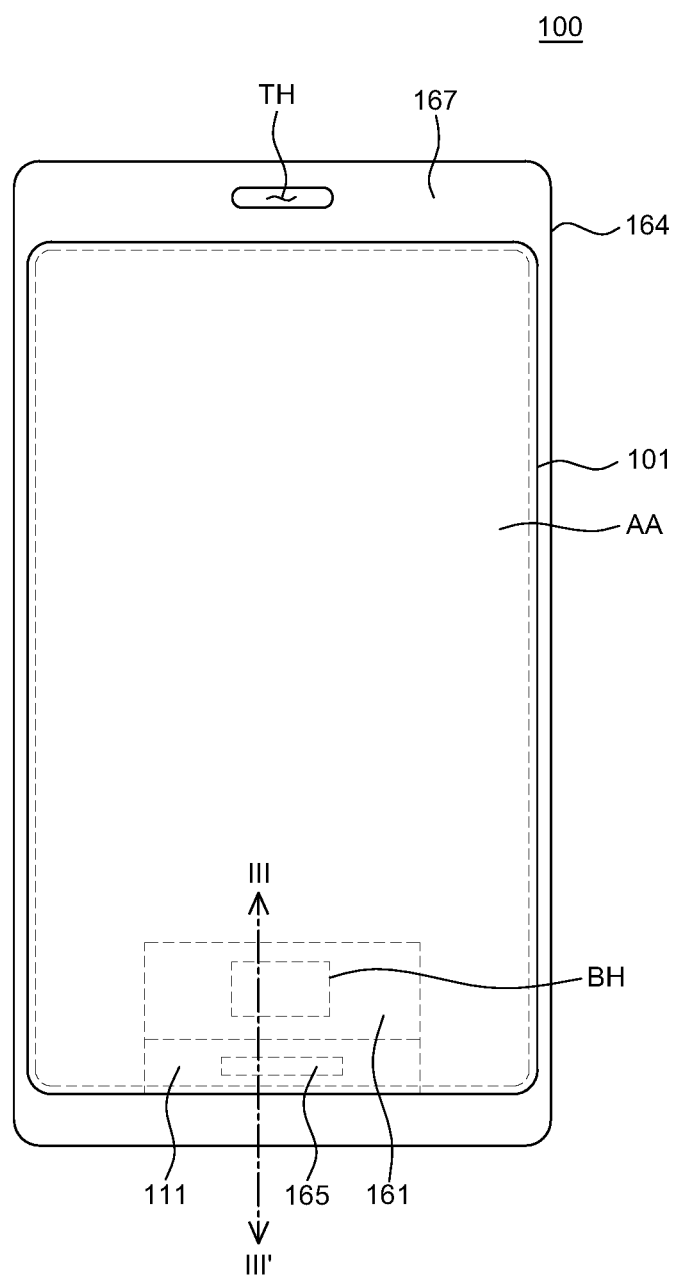
FIG. 7 is a plan view of a flexible display device according to an exemplary embodiment of the present disclosure.

FIG. 7 is a plan view of a flexible display device according to an exemplary embodiment of the present disclosure.

Figure 8:
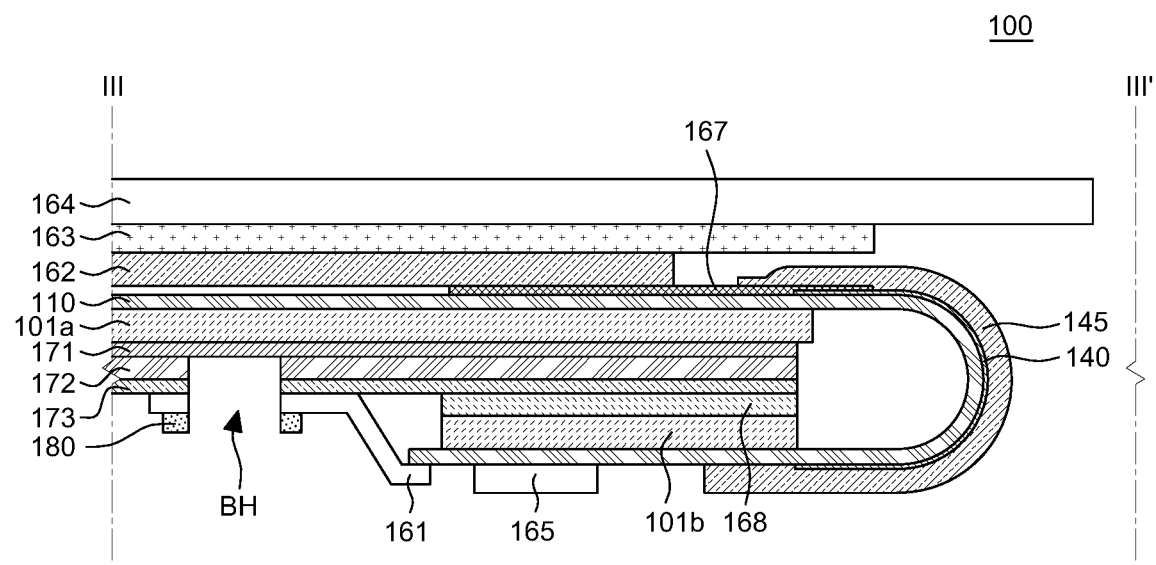
FIG. 8 is a cross-sectional view taken along the line III-III' of FIG. 7.

FIG. 8 is a cross-sectional view taken along the line of FIG. 7.

Specifically, FIG. 8 is a cross-sectional view of a bending area BA of a flexible display device 100 according to the exemplary embodiment of the present disclosure and a part of the display area AA in which a bottom hole BH is formed.

Referring to FIGS. 7 and 8, the flexible display device 100 according to the exemplary embodiment of the present disclosure includes back plates 101a and 101b, a display panel 110, a circuit element 161, a polarization plate 162, an adhesive layer 163, a cover glass 164, a driving IC 165, a light shielding pattern 167, a first cushion tape 172, a heat radiation sheet 173, and a second cushion tape 180.

The display panel 110 may include a first flat portion, a second flat portion, and a curved portion between the first flat portion and the second flat portion. The first flat portion corresponds to the display area AA having a plurality of sub pixels and maintains a flat state. The second flat portion is opposite to the first flat portion, corresponds to the pad unit PA having pads which are bonded to the circuit element 161, and maintains a flat state. The curved portion is an area where the circuit lines 140 which connect the display area AA and the pad unit PA are provided and maintains a bending state with a predetermined curvature.

In this case, for example, the curved portion may have a shape of "⊃". That is, the curved portion may extend from the first flat portion to be bent at 180° in the rear direction so that the second flat portion extending from the curved portion may overlap the first flat portion in the rear direction of the first flat portion. That is, the circuit element 161 which is bonded to the display panel 110 in the second flat portion may be located in the rear direction of the display panel 110 of the first flat portion.

Even though it is not illustrated in the drawing, a barrier film may be disposed above the display panel 110.

The barrier film is a component which protects various components of the display panel 110 and may be disposed so as to correspond to at least the display area AA of the display panel 110. The barrier film is not an essential component and may be omitted depending on the structure of the flexible display device 100. The barrier film may be configured to include an adhesive material and the adhesive material may be a thermally curable or naturally curable adhesive and configured by the material such as pressure sensitive adhesive (PSA) so as to serve to fix the polarization plate 162 on the barrier film.

The polarization plate 162 disposed on the barrier film is disposed on the display area AA to suppress the reflection of the external light. When the display device 100 is used at the outside, external natural light enters to be reflected by a reflective layer included in the anode of the electroluminescent element or reflected by an electrode which is formed of a metal and disposed below the electroluminescent element. Therefore, the image of the display device 100 may not be visibly recognized due to the light reflected as described above. The polarization plate 162 polarizes the light entering from the outside to a specific direction and suppresses the reflected light from being emitted to the outside of the display device 100. The polarization plate 162 may be disposed on the display area AA but is not limited thereto.

The polarization plate 162 may be configured by a polarizer and a protective film which protects the polarizer and may be formed by coating a polarization material for ensuring flexibility.

An adhesive layer 163 is disposed on the polarization plate 162 to bond a cover glass 164 which protects an outer appearance of the display device 100. That is, the cover glass 164 is provided to cover the front surface of the display panel 110 to protect the display panel 110. The above-described adhesive layer 163 may include an optically clear adhesive (OCA).

The light shielding pattern 167 may be formed on four edges of the display panel 110. The light shielding pattern 167 may be formed on an upper edge of the display panel 110. The light shielding pattern 167 may be formed to overlap a part of the polarization plate 162 and a part of the display panel 110 between the polarization plate 162 and the display panel 110, but it is not limited thereto.

The light shielding pattern 167 may be applied with black ink. In some exemplary embodiments, the light shielding pattern 167 may be configured by chrome (Cr) or graphite or a resin including conductive particles. The planarization layers 115c and 115d may be formed of one or more materials of acrylic resin, epoxy resin, phenolic resin, polyamides resin, polyimides resin, unsaturated polyesters resin, polyphenylene resin, polyphenylene sulfides resin, and benzocyclobutene, but are not limited thereto. The conductive particle may also be formed of molybdenum (Mo), chrome (Cr), titanium (Ti), nickel (Ni), neodymium (Nd), copper (Cu), and an alloy of silver (Ag) and magnesium (Mg) but is not limited thereto.

Even though it is not illustrated in the drawing, a touch screen panel may be further disposed above the display panel 110. In this case, the polarization plate 162 may be located above the touch screen panel. When the touch screen panel is included, the cover glass 164 may be provided to cover at least a part of the touch screen panel.

The touch screen panel includes a plurality of touch sensors. The touch sensor may be disposed in a position corresponding to the display area AA of the display panel 110. The touch sensor may include at least one of a mutual capacitive sensor and a self-capacitive sensor.

The mutual capacitive sensor includes a mutual capacitance formed between two touch electrodes. The mutual capacitance sensing circuit applies a driving signal (or a stimulus signal) to any one of two electrodes and senses a touch input based on a charge changing amount of the mutual capacitance by the other electrode. When a conductor approaches the mutual capacitance, an amount of charges of the mutual capacitance is reduced to sense a touch input or a gesture.

The self-conductive sensor includes a self-capacitance formed in each of the sensor electrodes. The self-capacitance sensing circuit supplies charges to the sensor electrodes and senses a touch input based on the charge changing amount of the self-capacitance. When the conductor approaches the self-capacitance, the capacitance of the sensor is connected to the capacitance by the conductor in parallel so that the capacitance is increased. Therefore, in the case of the self-capacitance, when the touch input is sensed, the capacitance of the sensor is increased.

A plurality of top holes (TH) may be provided above the display device 100. For example, the sensor hole H may include an optical sensor hole, a receiver hole, a camera hole, and a finger sensor hole (or a home button hole).

Back plates 101a and 101b may be disposed below the display panel 110. When the substrate of the display panel 110 is formed of a plastic material such as polyimide, a manufacturing process of a flexible display device 100 is performed in a situation in which a support substrate configured by glass is disposed below the display panel 110. After completing the manufacturing process, the support substrate is separated to be released.

Even after releasing the support substrate, a component for supporting the display panel 110 is necessary so that back plates 101a and 101b may be disposed below the display panel 110 to support the display panel 110.

The back plates 101a and 101b may suppress foreign materials from being attached to the lower portion of the substrate, and may serve to buffer damage from the outside.

The back plates 101a and 101b may be disposed to be adjacent to the bending area BA in an area of the display panel 110 other than the bending area BA.

The back plate 101a and 101b may include a first back plate 101a disposed on a rear surface of the first flat portion and a second back plate 101b disposed on a rear surface of the second flat portion. The first back plate 101a reinforces the rigidity of the first flat portion to maintain a flat state of the first flat portion. The second back plate 101b reinforces the rigidity of the second flat portion to maintain a flat state of the second flat portion. In the meantime, in order to ensure the flexibility of the curved portion and easily control the neutral plane using the micro coating layer 145, the back plates 101a and 101b are not located on the rear surface of the curved portion.

The back plates 101a and 101b may be formed of a plastic thin film formed of polyimide (PI), polyethylene naphthalate (PEN), polyethylene terephthalate (PET), polymers, and a combination of the polymers.

The first cushion tape 172 and the heat radiation sheet 173 are disposed between two back plates 101a and 101b. Specifically, the first cushion tape 172 is attached to the first back plate 101a by the adhesive 171 and the heat radiation sheet 173 is attached to the second back plate 101b by the adhesive tape 168.

In other words, the first back plate 101a is disposed on the rear surface of the display panel 110, the adhesive 171 is disposed on the rear surface of the first back plate 101, the first cushion tape 172 is disposed on the rear surface of the adhesive 171, the heat radiation sheet 172 is disposed on the rear surface of the first cushion tape 172, the adhesive tape 168 is disposed on the rear surface of the heat radiation sheet 172, and the second back plate 101b is disposed on the rear surface of the adhesive tape 168.

The above-described adhesive 171 may have an embossing pattern to improve air bubbles or waterproof function when the adhesive 171 is attached onto the rear surface of the first back plate 101a and may be configured as a pressure sensitive adhesive.

The first cushion tape 172 is compressed when an external force is applied to absorb damages. Specifically, the first cushion tape 172 may include a plurality of air bubbles and the plurality of air bubbles may effectively absorb the physical damage which is applied to the display device 100. The first cushion tape 172 may be formed of acrylic foam but is not limited thereto.

The heat radiation sheet 180 is disposed below the first cushion tape 172. The heat radiation sheet 180 discharges heat generated in the display panel 110. In addition, the heat radiation sheet 180 may perform a function of protecting the flexible display device 100 from the damage from the rear surface.

To this end, the heat radiation sheet 180 may be formed of a material having excellent heat conductivity and mechanical rigidity. For example, the heat radiation sheet 180 may be formed of a metal material and the heat radiation sheet 173 has a thermal conductance of 3000 W/mK and configured by copper (Cu) or stainless steel (SUS).

The circuit element 161 may be connected to an end of the second flat portion of the display panel 110. Various wiring lines may be formed on the circuit element 161 to transmit a signal to the pixel disposed in the display area AA. The circuit element 161 may be formed of a material having a flexibility to be bendable. That is, the circuit element 161 may be a flexible printed circuit board (FPCB).

One end of the circuit element 161 is connected to the second flat portion of the display panel 110 and the other end may be attached to a rear surface of the heat radiation sheet 173. Therefore, the circuit element 161 may be bent due to the step of the second flat portion of the display panel 110 and the heat radiation sheet 173.

The driving IC 165 may be mounted on the second flat portion of the display panel 110 and the second flat portion is connected to a wiring line formed on the circuit element 161 to supply a driving signal and the data to the sub pixel disposed in the display area AA.

The second cushion tape 180 may be attached onto the rear surface of the circuit element 161.

The second cushion tape 180 is compressed when an external force is applied to absorb damages. Specifically, the second cushion tape 180 may also include a plurality of air bubbles and the plurality of air bubbles may effectively absorb the physical impact which is applied to the display device 100. The second cushion tape 180 may also be formed of acrylic foam but is not limited thereto. The second cushion tape 180 may include an adhesive material to be in contact with the circuit element 161 and may be configured by acrylic form with a thickness of 0.2 mm or larger but is not limited thereto.

The second cushion tape 180 may completely overlap the circuit element 161. That is, the end of the second cushion tape 180 may be disposed inside more than the end of the circuit element 161. Therefore, the second cushion tape 180 may be supported by the circuit element 161 with respect to the rear direction so that the second cushion tape 180 may effectively absorb damages which may be generated when a sensor is inserted into the bottom hole BH.

The bottom hole BH may be formed to pass through the second cushion tape 380, the circuit element 161, the heat radiation sheet 173, and the first cushion tape 172.

Various sensors may be embodied in the bottom hole BH. For example, even though a fingerprint sensor may be disposed in the bottom hole BH, the present disclosure is not limited thereto and any one of an optical sensor hole, a receiver hole, and a camera may be disposed in the bottom hole BH.

In FIG. 8, it is illustrated that the bottom hole BH passes through a center of the second cushion tape 180 so that the second cushion tape 180 is divided into two, but the present disclosure is not limited thereto. That is, the bottom hole BH passes through only one side portion of the second cushion tape 180 so that the second cushion tape 180 may not be divided into two.

In other words, with respect to a top surface of the flexible display device 100, the second cushion tape 180 may be formed so as to correspond to a shape of the bottom hole BH. Specifically, as illustrated in FIG. 7, when the shape of the bottom hole BH is a quadrangular shape, the second cushion tape 180 may also have a quadrangular shape or a shape of "π" or "Π" which encloses the bottom hole BH.

Further, in FIG. 8, it is illustrated that the bottom hole BH passes through the second cushion tape 180, the circuit element 161, the heat radiation sheet 173, and the first cushion tape 172. However, the present disclosure is not limited thereto and the bottom hole BH does not pass through the first cushion tape 172, but passes through only the second cushion tape 180, the circuit element 161, and the heat radiation sheet 173.

Figure 9:
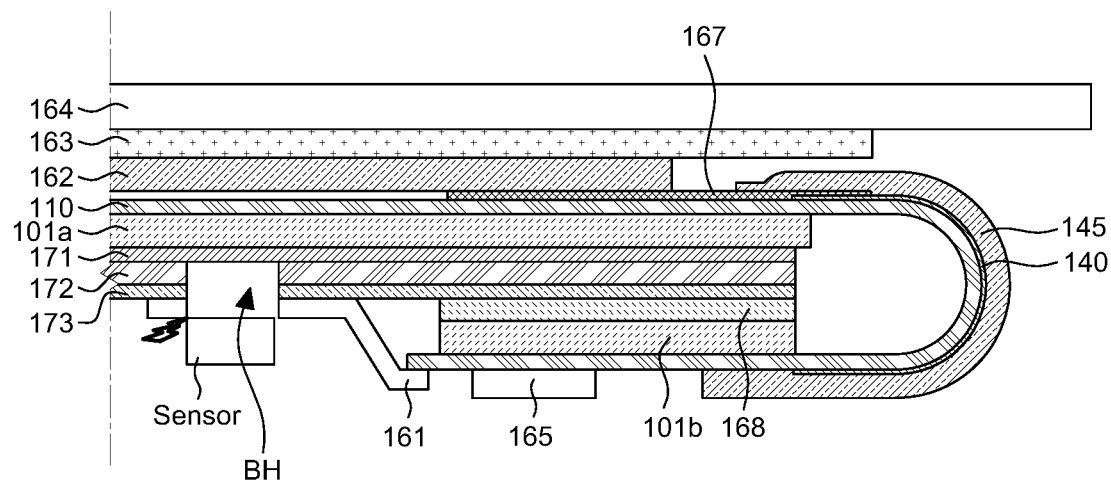
FIG. 9 is a cross-sectional view of a flexible display device according to the related art.

FIG. 9 is a cross-sectional view of a flexible display device according to the related art.

As illustrated in FIG. 9, when the second cushion tape 180 is not provided as in the flexible display device according to the related art, during the process of inserting the sensor into the bottom hole BH, it is highly likely that the inserted sensor may cause the damage on the circuit element 161 adjacent to the bottom hole BH. The damage applied to the circuit element 161 adjacent to the bottom hole BH may be transmitted to the display panel 110. Therefore, in the flexible display device according to the related art, there was a problem in that a defective image of the display panel 110 was caused by a denting phenomenon due to the sensor inserting process.

In order to solve the above-mentioned problem, the flexible display device 100 according to the exemplary embodiment of the present disclosure may include the second cushion tape 180 at a side portion of the lower end of the bottom hole BH.

Therefore, even though the sensor applies the damage onto the second cushion tape 180 adjacent to the bottom hole BH during the process of inserting the sensor into the bottom hole BH, the second cushion tape 180 may absorb the above-described damage. Therefore, the damage caused by the sensor inserting process may not be transmitted to the display panel 110.

That is, in the flexible display device 100 according to the exemplary embodiment of the present disclosure, even though the sensor inserting process is performed, the defective image due to the dent of the flexible display device 100 may be suppressed. In other words, a yield of the process of inserting a sensor into the bottom hole of the flexible substrate may be improved.

Figure 10A:
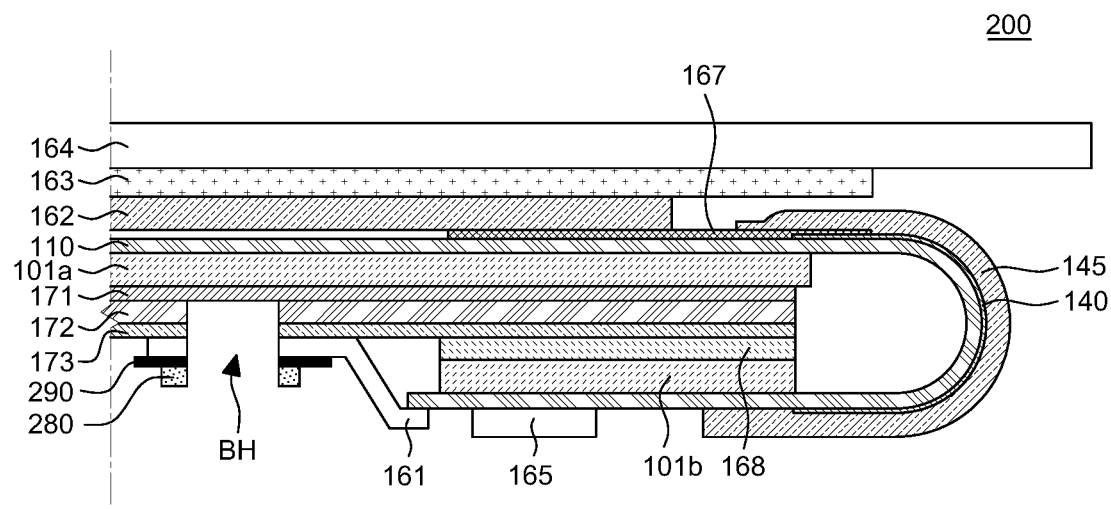
FIGS. 10A and 10B are cross-sectional views of a flexible display device according to another exemplary embodiment of the present disclosure.
Figure 10B:
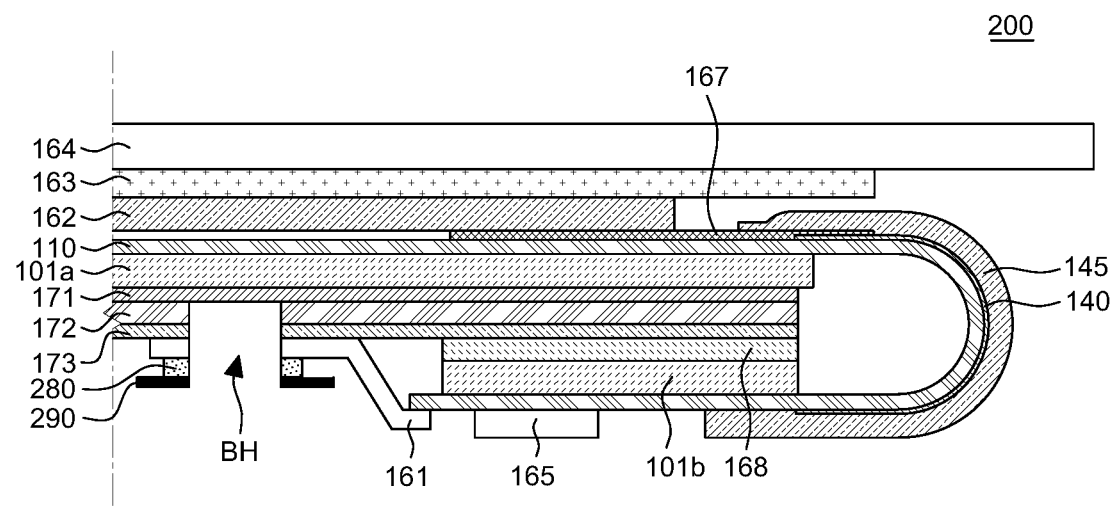

FIGS. 10A and 10B are cross-sectional views of a flexible display device according to another exemplary embodiment of the present disclosure.

A flexible display device 200 according to another exemplary embodiment of the present disclosure of FIGS. 10A and 10B is substantially configured by the same configuration as the flexible display device 100 according to the exemplary embodiment of the present disclosure of FIGS. 7 and 8 except for a second cushion tape 280 and an insulating tape 290. Therefore, the same reference numerals may be used for the same components.

Referring to FIGS. 10A and 10B, the flexible display device 200 according to another exemplary embodiment of the present disclosure may further include an insulating tape 290 disposed below the circuit element 161.

The above-described insulating tape 290 is disposed below the circuit element 161 to cover the circuit element 161 so that the circuit element 161 may be electrically protected from the external static electricity.

The insulating tape 290 may be formed of an insulating material to suppress the static electricity from flowing into the circuit element 161. That is, the insulating unit INS may be configured by an inorganic insulating material such as silicon oxide (SiOx) or silicon nitride (SiNx) or an organic insulating material such as polyimide (PI).

As illustrated in FIG. 10A, the insulating tape 290 is disposed on a rear surface of the circuit element 161 and the second cushion tape 280 may be disposed on the rear surface of the insulating tape 290 or may be in contact with the rear surface of the insulating tape 290.

Alternatively, as illustrated in FIG. 10B, the second cushion tape 280 may be disposed on the rear surface of the circuit element 161 and the insulating tape 290 may be disposed on the rear surface of the second cushion tape 280 or may be in contact with the rear surface of the second cushion tape 280.

That is, as illustrated in FIGS. 10A and 10B, the insulating tape 290 may be disposed below the circuit element 161.

One side of the insulating tape 290 may be disposed outside more than one side of the circuit element 161 to cover the circuit element 161. Further, in accordance with the necessity for a design, the insulating tape 290 extends to the driving IC 165 to cover both the circuit element 161 and the driving IC 165.

Figure 11:
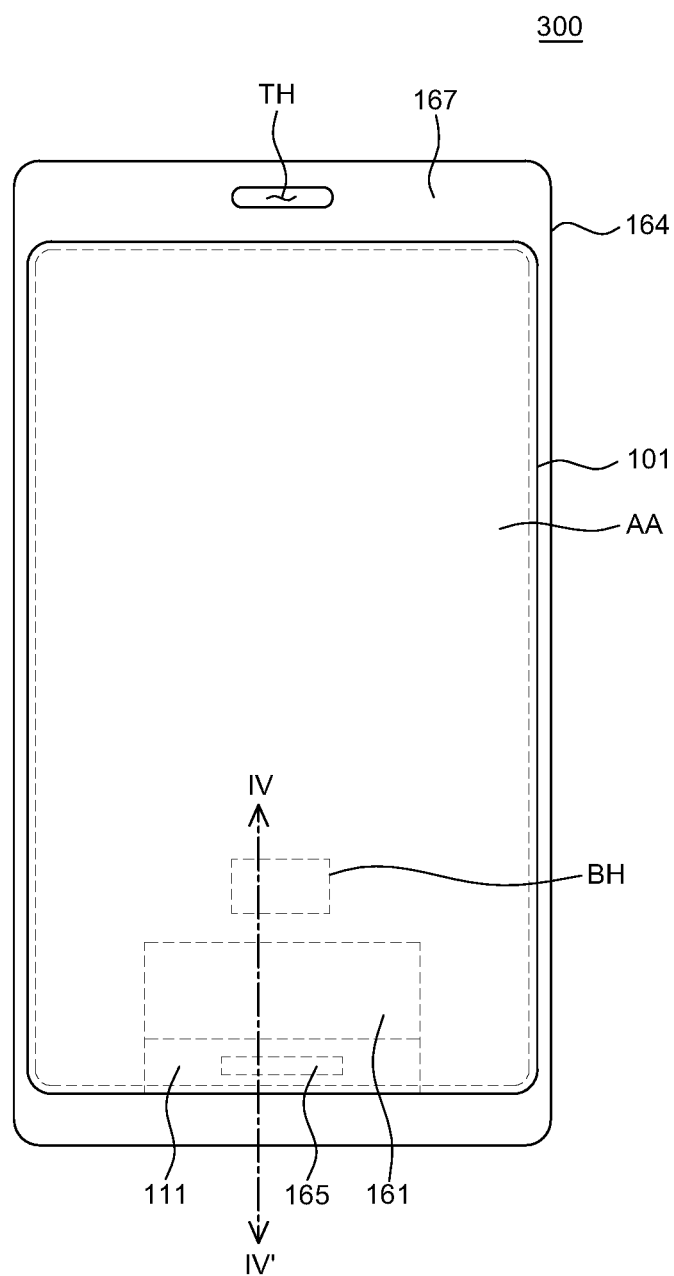
FIG. 11 is a plan view of a flexible display apparatus according to still another exemplary embodiment of the present disclosure.

FIG. 11 is a plan view of a flexible display apparatus according to still another exemplary embodiment of the present disclosure.

Figure 12:
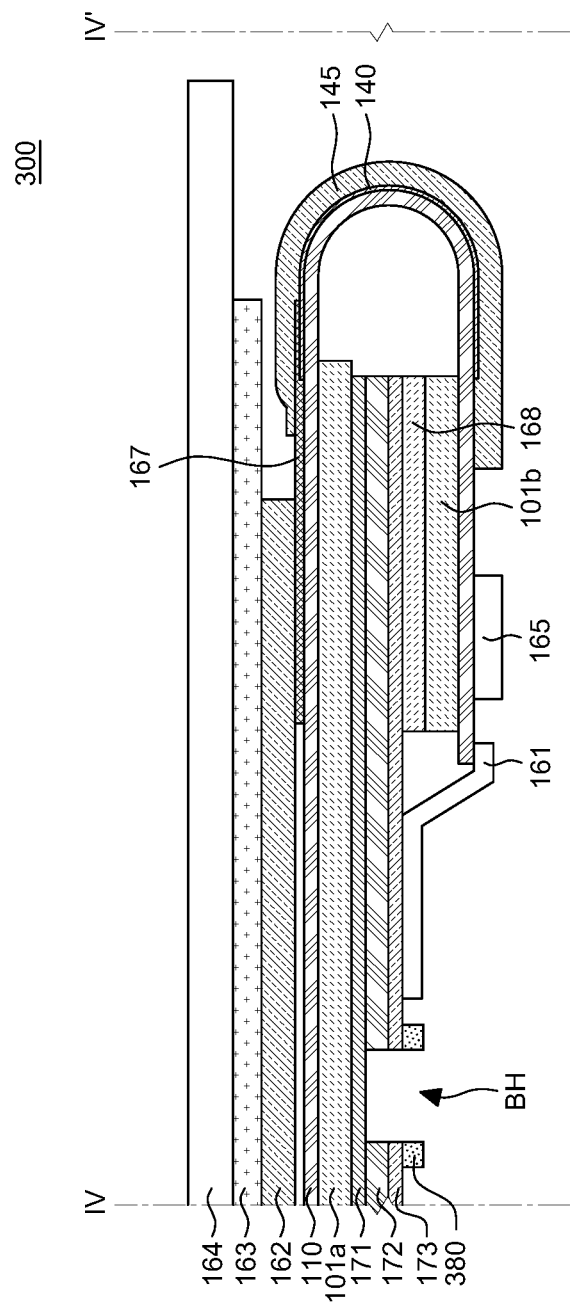
FIG. 12 is a cross-sectional view taken along the line IV-IV' of FIG. 11.

FIG. 12 is a cross-sectional view taken along the line IV-IV' of FIG. 11.

A flexible display device 300 according to still another exemplary embodiment of the present disclosure of FIGS. 11 and 12 is substantially configured by the same configuration as the flexible display device 100 according to the exemplary embodiment of the present disclosure of FIGS. 7 and 8 except for a position of the bottom hole BH and a position of a second cushion tape 380. Therefore, the same reference numerals may be used for the same components and the description may be partially omitted.

Referring to FIGS. 11 and 12, in a flexible display device 300 according to still another exemplary embodiment of the present disclosure, the second cushion tape 380 is disposed on a rear surface of the heat radiation sheet 173 and is spaced apart from the circuit element 161. That is, the second cushion tape 380 does not overlap the circuit element 161 or is not in contact with the circuit element 161 but is in contact with the rear surface of the heat radiation sheet 173.

The second cushion tape 380 is compressed when an external force is applied to absorb damages. Specifically, the second cushion tape 380 may also include a plurality of air bubbles and the plurality of air bubbles may effectively absorb the physical impact which is applied to the display device 300. The second cushion tape 380 may also be formed of acrylic foam but is not limited thereto. The second cushion tape 380 may include an adhesive material to be in contact with the heat radiation sheet 173 and may be configured by acrylic form with a thickness of 0.2 mm or larger but is not limited thereto.

The bottom hole BH may be formed to pass through the second cushion tape 180, the heat radiation sheet 173, and the first cushion tape 172.

That is, the bottom hole BH is also formed so as not to overlap the circuit element 161 so that the bottom hole BH does not pass through the circuit element 161.

Various sensors may be embodied in the bottom hole BH. For example, even though a fingerprint sensor may be disposed in the bottom hole BH, the present disclosure is not limited thereto and any one of an optical sensor hole, a receiver hole, and a camera hole may be disposed in the bottom hole BH.

In FIG. 12, it is illustrated that the bottom hole BH passes through a center of the second cushion tape 380 so that the second cushion tape 380 is divided into two, but the present disclosure is not limited thereto. That is, the bottom hole BH passes through only one side portion of the second cushion tape 380 so that the second cushion tape 180 may not be divided into two.

Further, in FIG. 12, it is illustrated that the bottom hole BH passes through the second cushion tape 380, the heat radiation sheet 173, and the first cushion tape 172. However, the present disclosure is not limited thereto and the bottom hole BH does not pass through the first cushion tape 172, but passes through only the second cushion tape 380, the circuit element 161, and the heat radiation sheet 173.

The flexible display device according to still another exemplary embodiment of the present disclosure may also include the second cushion tape 380 at a side portion of a lower end of the bottom hole BH.

Therefore, the damage caused by the sensor inserting process may not be transmitted to the display panel 110 so that even though the sensor inserting process is performed, the defective image due to the dent of the flexible display device 300 may be suppressed.

Figure 13:
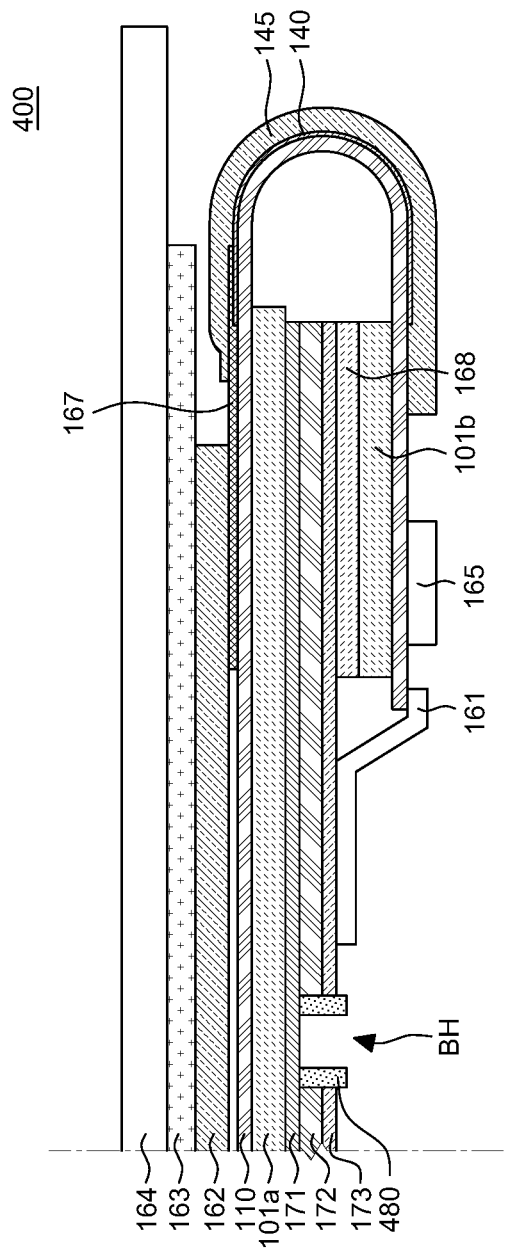
FIG. 13 is a cross-sectional view of a flexible display apparatus according to still another exemplary embodiment of the present disclosure.

FIG. 13 is a cross-sectional view of a flexible display apparatus according to still another exemplary embodiment of the present disclosure.

A flexible display device 400 according to still another exemplary embodiment of the present disclosure of FIG. 13 is substantially configured by the same configuration as the flexible display device 300 according to another exemplary embodiment of the present disclosure of FIGS. 11 and 12 except for a placement relationship of a second cushion tape 480. Therefore, the same reference numerals may be used for the same components.

In the flexible display device 400 according to still another exemplary embodiment of the present disclosure, a second cushion tape 480 may be disposed on an inner surface of the bottom hole BH.

That is, in the flexible display device 400 according to still another exemplary embodiment of the present disclosure, the bottom hole BH passes through the heat radiation sheet 173 and the first cushion tape 172. The second cushion tape 480 may be in contact with an inner surface of the heat radiation sheet 173 and an inner surface of the first cushion tape 172. The second cushion tape 480 may protrude from the rear surface of the heat radiation sheet 173. In other words, the second cushion tape 480 disposed below the heat radiation sheet 173 may extend to the inner surface of the heat radiation sheet 173 and the inner surface of the first cushion tape 172.

Even though it is not illustrated in the drawing, in the flexible display device 400 according to still another exemplary embodiment of the present disclosure, the bottom hole BH may pass through only the heat radiation sheet 173, and the second cushion tape 480 may be in contact with the inner surface of the heat radiation sheet 173. The second cushion tape 480 may protrude from the rear surface of the heat radiation sheet 173.

Therefore, when the sensor is inserted into the bottom hole BH of the flexible display device 400, the sensor may not apply the damage onto the rear surface of the heat radiation sheet 173 but apply the damage onto the second cushion tape 480. However, the second cushion tape 480 may absorb the above-described damage. Therefore, the damage caused by the sensor inserting process may not be transmitted to the display panel 110. That is, in the flexible display device 400 according to still another exemplary embodiment of the present disclosure, even though the sensor inserting process is performed, the defective image due to the dent of the flexible display device 400 may be suppressed.

The exemplary embodiments of the present disclosure can also be described as follows:

According to an aspect of the present disclosure, a flexible display device includes: a display panel which includes a display area and a bending area extending from one side of the display area to be bent; a first back plate disposed on a rear surface of the display area; a first cushion tape disposed on a rear surface of the first back plate; a heat radiation sheet disposed on a rear surface of the first cushion tape; a second cushion tape which is disposed below the heat radiation sheet and absorbs a damage from the outside; and a bottom hole which passes through the first cushion tape, the heat radiation sheet, and the second cushion tape.

The flexible display device according may further comprise a circuit element which is connected to an end of the display panel and is disposed on the rear surface of the first cushion tape.

The bottom hole may pass through the circuit element.

The bottom hole may be formed to be spaced apart from the circuit element.

The second cushion tape completely may overlap the circuit element.

The flexible display device may further comprise an insulating tape which is in contact with a rear surface of the circuit element.

The flexible display device may further comprise an insulating tape which is in contact with a rear surface of the second cushion tape.

The second cushion tape may be in contact with an inner surface of the first cushion tape and an inner surface of the heat radiation sheet.

The second cushion tape may be configured by acrylic foam.

The bottom hole may pass through the circuit element.

The bottom hole may be formed inside more than the circuit element so that the bottom hole does not pass through the circuit element.

An end of the second cushion tape may be disposed inside more than an end of the circuit element.

The flexible display device may further comprise an insulating tape which covers the circuit element.

The second cushion tape may extend to an inner surface of the first cushion tape and an inner surface of the heat radiation sheet.

The second cushion tape may be configured by acrylic foam.

According to another aspect of the present disclosure, a flexible display device includes: a display panel which includes a first flat portion, a second flat portion, and a curved portion located between the first flat portion and the second flat portion; a first back plate disposed on a rear surface of the first flat portion of the display panel; a first back plate disposed on a rear surface of the first flat portion of the display panel; a first cushion tape and a heat radiation sheet disposed between the first back plate and the second back plate; a bottom hole which passes through the first cushion tape and the heat radiation sheet; and a second cushion tape which encloses an entrance of the bottom hole and absorbs a damage from the outside.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
a display panel including a display area and a bending area extending from one side of the display area, the bending area being bendable;
a first back plate disposed on a rear surface of the display area of the display panel;
a heat radiation sheet disposed on a rear surface of the first back plate; and
a bottom hole passing through the heat radiation sheet,
wherein an entirety of the bottom hole overlaps the display area.

2. The flexible display device of claim 1, further comprising:
a first cushion tape disposed on a rear surface of the first back plate.

3. The flexible display device of claim 1, further comprising:
a circuit element connected to an end of the display panel.

4. The flexible display device of claim 3, wherein the bottom hole is spaced apart from the circuit element.

5. The flexible display device of claim 3, further comprising:
an insulating tape in contact with a rear surface of the circuit element.

6. The flexible display device of claim 1, further comprising:
a fingerprint recognition sensor disposed in the bottom hole.

7. The flexible display device of claim 1, further comprising:
a camera disposed in the bottom hole.

8. The flexible display device of claim 1, further comprising:
a second cushion tape disposed below the heat radiation sheet and configured to absorb an external impact.

9. A flexible display device, comprising:
a display panel including a first flat portion, a second flat portion, and a curved portion between the first flat portion and the second flat portion;
a first back plate disposed on a rear surface of the first flat portion of the display panel;
a second back plate disposed on a rear surface of the second flat portion of the display panel;
a heat radiation sheet disposed between the first back plate the second back plate; and
a bottom hole passing through the heat radiation sheet,
wherein the first flat portion of the display panel includes a display area, and
wherein an entirety of the bottom hole overlaps the display area.

10. The flexible display device of claim 9, further comprising:
a first cushion tape disposed between the first back plate and the second back plate.

11. The flexible display device of claim 9, further comprising:
a circuit element connected to one end of the second flat portion and a rear surface of the heat radiation sheet.

12. The flexible display device of claim 11, wherein the bottom hole is spaced apart from the circuit element.

13. The flexible display device of claim 11, further comprising:
an insulating tape covering the circuit element.

14. The flexible display device of claim 9, further comprising:
a fingerprint recognition sensor disposed in the bottom hole.

15. The flexible display device of claim 9, further comprising:
a camera disposed in the bottom hole.

16. The flexible display device of claim 9, further comprising:
a second cushion tape enclosing an opening of the bottom hole and configured to absorb an external impact.

17. A flexible display device, comprising:
a display panel bent in a bending area;
a plurality of back plates adjacent to the bending area in an area of the display panel other than the bending area;
a heat radiation sheet disposed between the back plates;
a bottom hole passing through the heat radiation sheet;
wiring lines on the bending area of the display panel and having a triple layered structure of titanium (Ti)/aluminum (Al)/titanium (Ti);
a passivation layer enclosing an upper portion and a side portion of the bending area of the display panel; and
a micro coating layer disposed on the bending area of the display panel,
wherein the display panel includes a display area extending from one side of the bending area, and
wherein an entirety of the bottom hole overlaps the display area.

18. The flexible display device of claim 17, further comprising:
a first cushion tape disposed between the back plates.

* * * * *